United States Patent [19]
Sakakura et al.

[11] Patent Number: 5,852,384
[45] Date of Patent: Dec. 22, 1998

[54] DUAL BAND OSCILLATOR CIRCUIT USING STRIP LINE RESONATORS

[75] Inventors: Makoto Sakakura, Kyoto; Hisanaga Miyoshi, Aichi; Kouji Hashimoto, Hyogo; Nobuo Fuse, Osaka; Hiroaki Kosugi, Osaka; Kaoru Ishida, Osaka, all of Japan

[73] Assignee: Matsushita Electric Industrial Co., Ltd., Osaka, Japan

[21] Appl. No.: 844,039

[22] Filed: Apr. 18, 1997

[30] Foreign Application Priority Data

| Apr. 25, 1996 | [JP] | Japan | 8-105798 |
| May 14, 1996 | [JP] | Japan | 8-119098 |
| Jun. 14, 1996 | [JP] | Japan | 8-153565 |

[51] Int. Cl.[6] .............. H03B 5/12; H03B 5/18
[52] U.S. Cl. .............. 331/48; 331/49; 331/75; 331/99; 331/117 D; 331/177 V; 331/179
[58] Field of Search ................ 331/48, 49, 74, 331/75, 96, 99, 117 D, 177 V, 179

[56] References Cited

U.S. PATENT DOCUMENTS

| 3,889,210 | 6/1975 | Matsuura et al. | 331/179 |
| 4,353,038 | 10/1982 | Rose et al. | 331/179 |
| 4,660,002 | 4/1987 | Lijima et al. | 331/179 |
| 5,263,182 | 11/1993 | Park | 455/188.1 |
| 5,420,646 | 5/1995 | Dobrovolny | 348/731 |

FOREIGN PATENT DOCUMENTS

| 0 696 843 | 2/1996 | European Pat. Off. . |
| 26 07 530 | 9/1977 | Germany . |
| 62-006504 | 1/1987 | Japan . |
| 05-259737 | 10/1993 | Japan . |

OTHER PUBLICATIONS

Chen Yu Chi, et al., "Switched Resonators Boost the Bandwidth of Microwave VCOs," *Microwaves & RF*, p. 131 ff, May 1990.

*Primary Examiner*—Siegfried H. Grimm
*Attorney, Agent, or Firm*—Merchant, Gould, Smith, Edell, Welter & Schmidt, P.A.

[57] ABSTRACT

A dual band oscillator circuit according to the present invention comprises an oscillator circuit portion that oscillates at a first frequency, an oscillator circuit portion that oscillates at a second frequency, a buffer amplifier circuit portion to which an output of the first oscillator circuit portion is input through a first stage-to-stage coupling element and an output of the second oscillator circuit portion is input through a second stage-to-stage coupling element. Operation is switched between the first and second oscillator circuits by an externally applied control voltage signal.

13 Claims, 11 Drawing Sheets

DUAL BAND OSCILLATOR CIRCUIT USING STRIP LINE RESONATORS

BACKGROUND OF THE INVENTION

1. Field of the Invention

The present invention relates to a small voltage-controlled oscillator (VCO) used in mobile communication systems such as mobile telephones and portable telephones and in satellite communication equipment.

2. Description of the Prior Art

FIG. 11 shows a prior art dual band oscillator circuit for generating signals of two different frequency bands. In FIG. 11, 1a denotes a first oscillator circuit portion, 1b denotes a second oscillator circuit portion, 2a denotes a first buffer amplifier portion, 2b denotes a second buffer amplifier portion, 3 denotes a single-pole double-throw switch, 16a and 16b denote stage-to-stage coupling capacitors, 22 denotes a high-frequency output terminal.

The operation of the above conventional dual band oscillator circuit will be described below. In FIG. 11, the first oscillator circuit portion 1a utilizes a first frequency band, and the second oscillator circuit utilizes a second frequency band of the two frequency bands. An oscillation signal from the first oscillator circuit portion 1a is amplified in the first buffer amplifier portion 2a after passing the stage-to-stage coupling capacitor 16a. Similarly, an oscillation signal from the second oscillator circuit portion 1b is amplified in the second buffer amplifier portion 2b after passing the stage-to-stage coupling capacitor 16b. The signals amplified in the buffer amplifier portions 2a and 2b are each input to the single-pole double-throw switch 3. By operating the single-pole double-throw switch 3 according to a control signal provided to a control terminal for switching output frequencies 23, only a desired frequency signal to be output is produced from the high-frequency output terminal 22. Thus, a high-frequency oscillator circuit in two frequency bands is implemented.

However, in the above configuration, two buffer amplifier circuits, one for each frequency band, are required. Also, the single-pole double-throw switch is required for switching the outputs of two buffer amplifier portions. For these reasons, the size of the circuit becomes larger, increasing the size of the entire device.

A second prior art approach is disclosed in "Switched Resonators Boost the Bandwidth of Microwave VCOs" by Chen Yu. Chi and Chen Y. Ho, Microwaves & RF, May 1990, pp 131–pp 140. In this document, a resonance circuit portion includes a combination of two inductors and a PIN diode switch. In this circuit, by controlling the on/off condition of the PIN diode switch according to a frequency band to be oscillated, inductors operating as resonators are switched for switching resonance frequencies. Thus, a high-frequency oscillator circuit operating in a broad frequency band is implemented in this document.

In the above configuration, oscillation can be achieved for two frequency bands within a broad frequency range. However, there is no configuration for optimizing the C/N ratio (carrier-to-noise ratio) characteristics of the oscillator circuit in desired two frequency bands disclosed.

SUMMARY OF THE INVENTION

The present invention seeks to provide a dual band oscillator circuit which is capable of oscillating in two frequency bands and does not degrade C/N ratio characteristics in respective frequency bands while reducing the size of the circuit and contributing to a reduction in the size of the entire device.

In order to achieve the above objects, a dual band oscillator circuit according to the present invention comprises a first oscillator circuit for oscillating in a first frequency band, a second oscillator circuit for oscillating in a second frequency band, and a buffer amplifier circuit to which an output of the first oscillator circuit is input through a first stage-to-stage coupling element and an output of the second oscillator circuit is input through a second stage-to-stage coupling element, and input terminals for control voltages for controlling the first and second oscillator circuits to alternatively operate the first or second oscillator circuit. According to such a configuration, a single-pole double-throw switch for switching buffer amplifier outputs as used in a conventional circuit is unnecessary, and only one buffer amplifier circuit is necessary, rather than two.

For example, it is preferable that base voltages of oscillation transistors constituting the first and second oscillator circuits are respectively controlled by control voltages applied externally to provide switchable control of the oscillation transistor.

A resonance circuit portion constituting the oscillator circuit, such as a resonance circuit portion that changes a resonance frequency according to an externally applied voltage, may be provided in respective first and second oscillator circuits. However, by providing a common dual band resonance circuit, two resonance circuits are reduced to one. In other words, the dual band oscillator circuit may comprise a dual band resonance circuit having both resonance frequencies of the first and second frequency bands, and the dual band resonance circuit is connected to the oscillation transistor of the first oscillator circuit via a first resonator-transistor coupling capacitor and is connected to the oscillation transistor of the second oscillator circuit via a second resonator-transistor coupling capacitor.

It is preferable that the above dual band resonance circuit comprises a strip line resonator having a ground end and an open end and a varactor diode whose anode terminal is grounded, the open end of the strip line resonator and a cathode terminal of the varactor diode being connected by a capacitor, and a predetermined position between the ground end and the open end of the strip line resonator and the cathode terminal of the varactor diode being connected by another capacitor.

Furthermore, it is preferable that the other end of the first resonator-transistor coupling capacitor connected to the oscillation transistor of the first oscillator circuit is connected to a position between the ground end and the open end of the strip line resonator of the dual band resonance circuit, the position being a node of a voltage standing wave caused by resonance of the second frequency band. Thus, oscillating in the second frequency band, the effect of capacitive coupling to the first oscillator circuit and the resonator is reduced.

For a similar purpose, it is preferable that a switch element is interposed between the first resonator-transistor coupling capacitor and the oscillation transistor of the first oscillator circuit. This switch element is interposed to be in a conductive state during the operation of the first oscillator circuit and in a disconnected state during the operation of the second oscillator circuit.

Also, it is preferable that an impedance of the first stage-to-stage coupling element is low so as to be in a conductive state in the first frequency band and is high so as to be in an open state in the second frequency band. Thus, when oscillating in the second frequency band, the effect of coupling the first oscillator circuit and the common buffer amplifier can be reduced.

Furthermore, another embodiment of a dual band oscillator circuit according to the present invention comprises a transistor for oscillation, feedback circuits having two or more different impedances with respect to the transistor, and a resonance circuit connected to the transistor capable of selecting two or more different resonance frequencies. The use of such a configuration permits the use of one oscillation transistor, rather than two as in conventional circuits. Therefore, the size of the circuit can be reduced. In this case, with one oscillation transistor, the impedances of the feedback circuits with respect to the transistor can be selected to be optimized with respect to each of the two oscillation frequency bands. Therefore, it is possible to ensure high C/N ratio characteristics in each oscillating operation.

For a similar reason, another embodiment of a dual band oscillator circuit according to the present invention comprises a transistor for oscillation, feedback circuits with respect to the transistor capable of selecting two or more different impedances, and a resonance circuit connected to the transistor having two or more different resonance frequencies.

DESCRIPTION OF THE PREFERRED EMBODIMENTS (First Embodiment)

Figure 1:
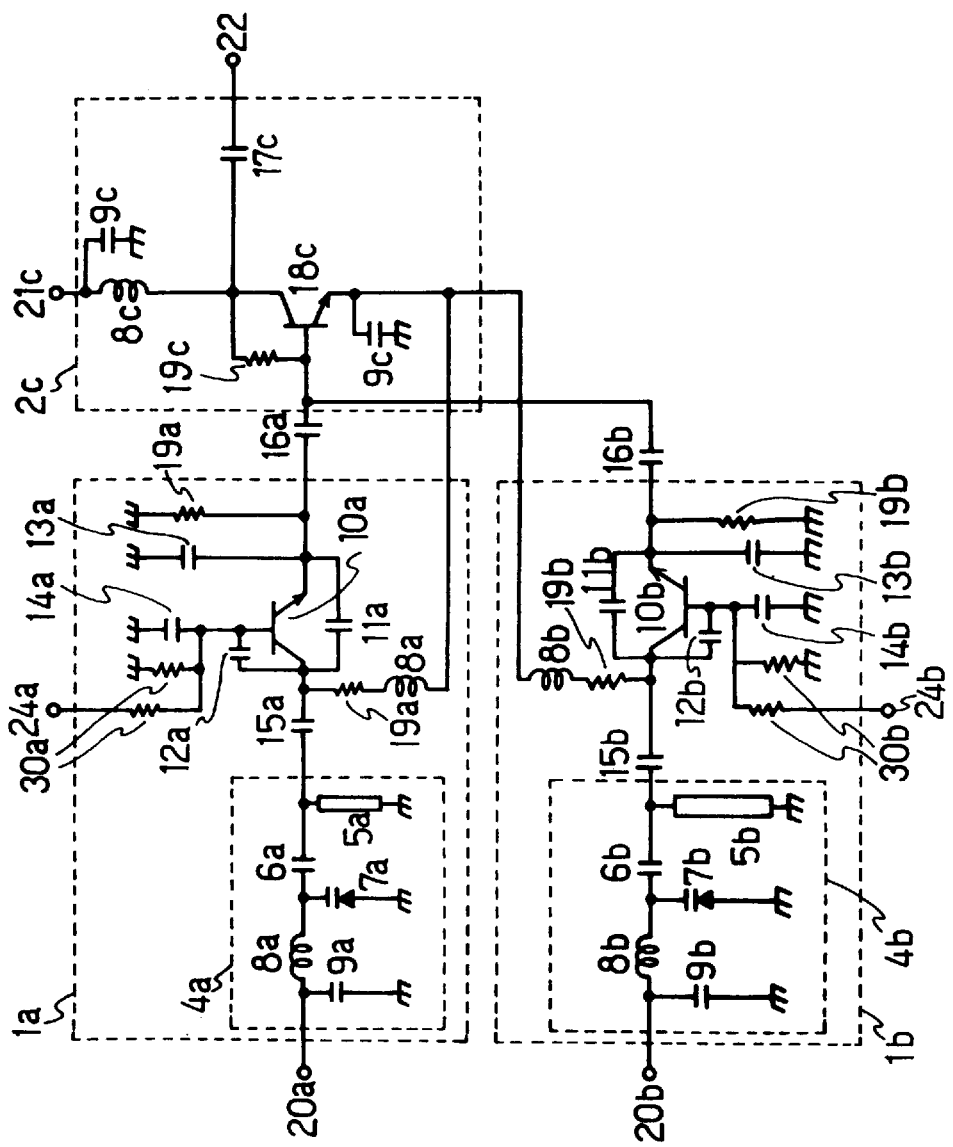
FIG. 1 shows a circuit diagram of a first embodiment of a dual band oscillator circuit according to the present invention.

In FIG. 1, $1a$ denotes a first oscillator circuit portion, $1b$ denotes a second oscillator circuit portion, $2c$ denotes a buffer amplifier portion, $4a$ denotes a first resonance circuit portion, $4b$ denotes a second resonance circuit portion, $5a$ and $5b$ denote resonators, $6a$ and $6b$ denote resonator-varactor diode coupling capacitors, $7a$ and $7b$ denote varactor diodes, $8a$, $8b$, and $8c$ denote high-frequency chokes, $9a$, $9b$, and $9c$ denote high-frequency ground capacitors, $10a$ and $10b$ denote oscillation transistors, $11a$ and $11b$ denote collector-emitter capacitors, $12a$ and $12b$ denote collector-base capacitors, $13a$ and $13b$ denote emitter-ground capacitors, $14a$ and $14b$ denote base-ground capacitors, $15a$ and $15b$ denote resonator-transistor coupling capacitors, $16a$ and $16b$ denote stage-to-stage coupling capacitors, $17c$ denotes an output coupling capacitor, $18c$ denotes a buffer amplifier transistor, $19a$, $19b$, and $19c$ denote bias resistors, $20a$ and $20b$ denote tuning voltage supply terminals, $21c$ denotes a power supply terminal, $22$ denotes a high-frequency output terminal, $24a$ denotes a first base bias control terminal, $24b$ denotes a second base bias control terminal, and $30a$ and $30b$ denote base bias resistors.

The collector-emitter capacitor $11a$, the collector-base capacitor $12a$, the emitter-ground capacitor $13a$, the base-ground capacitor $14a$, and the resonator-transistor coupling capacitor $15a$, which constitute the first oscillator circuit portion $1a$, have respective capacitance values selected to be in an optimal oscillation state in a first frequency band. Also, the collector-emitter capacitor $11b$, the collector-base capacitor $12b$, the emitter-ground capacitor $13b$, the base-ground capacitor $14b$, and the resonator-transistor coupling capacitor $15b$, which constitute the second oscillator circuit portion $1b$, have respective capacitance values selected to be in an optimal oscillation state in a second frequency band.

The first oscillator circuit portion $1a$ oscillates at a first frequency according to a voltage externally applied to the tuning voltage supply terminal $20a$, and its oscillation output is provided to the buffer amplifier portion $2c$ through the stage-to-stage coupling capacitor $16a$. Also, the second oscillator circuit portion $1b$ oscillates at a second frequency according to a voltage externally applied to the tuning voltage supply terminal $20b$, and its oscillation output is provided to the buffer amplifier portion $2c$ through the stage-to-stage coupling capacitor $16b$.

The first base bias control terminal $24a$ is provided to apply a control voltage externally to the base of the first oscillation transistor $10a$ through the base bias resistor $30a$. Similarly, the second base bias control terminal $24b$ is provided to apply a control voltage externally to the base of the second oscillation transistor $10b$ constituting the second oscillator circuit portion $1b$ through the base bias resistor $30b$.

According to the above configuration, when producing the oscillation output at the first frequency, a predetermined voltage is applied to the first base bias control terminal $24a$, and no voltage is applied to the second base bias control terminal $24b$. As a result, only the first oscillator circuit portion $1a$ becomes operational, and its oscillation output is amplified in the buffer amplifier portion $2c$, after passing the stage-to-stage coupling capacitor $16a$, to be output from the high-frequency output terminal $22$. When producing the oscillation output at the second frequency, a predetermined voltage is applied to the second base bias control terminal $24b$, and no voltage is applied to the first base bias control terminal $24a$. As a result, only the second oscillator circuit portion $1b$ becomes operational, and its oscillation output is amplified in the buffer amplifier portion $2c$, after passing the stage-to-stage coupling capacitor $16b$, to be output from the high-frequency output terminal $22$.

As indicated above, in this embodiment the outputs of the first and second oscillator circuit portions $1a$ and $1b$ are connected to one buffer amplifier portion $2c$ to selectively operate either the first or second oscillator circuit portion $1a$ or $1b$ depending on control voltages applied to the first and second base bias control terminals 24a and 24b. Therefore, no single-pole double-throw switch for switching the outputs of buffer amplifier portions is required, and only one buffer amplifier is required, rather than two. As a result, the size of the circuit may be reduced, thus permitting a reduction in the size of the entire device.

(Second Embodiment)

Figure 2:
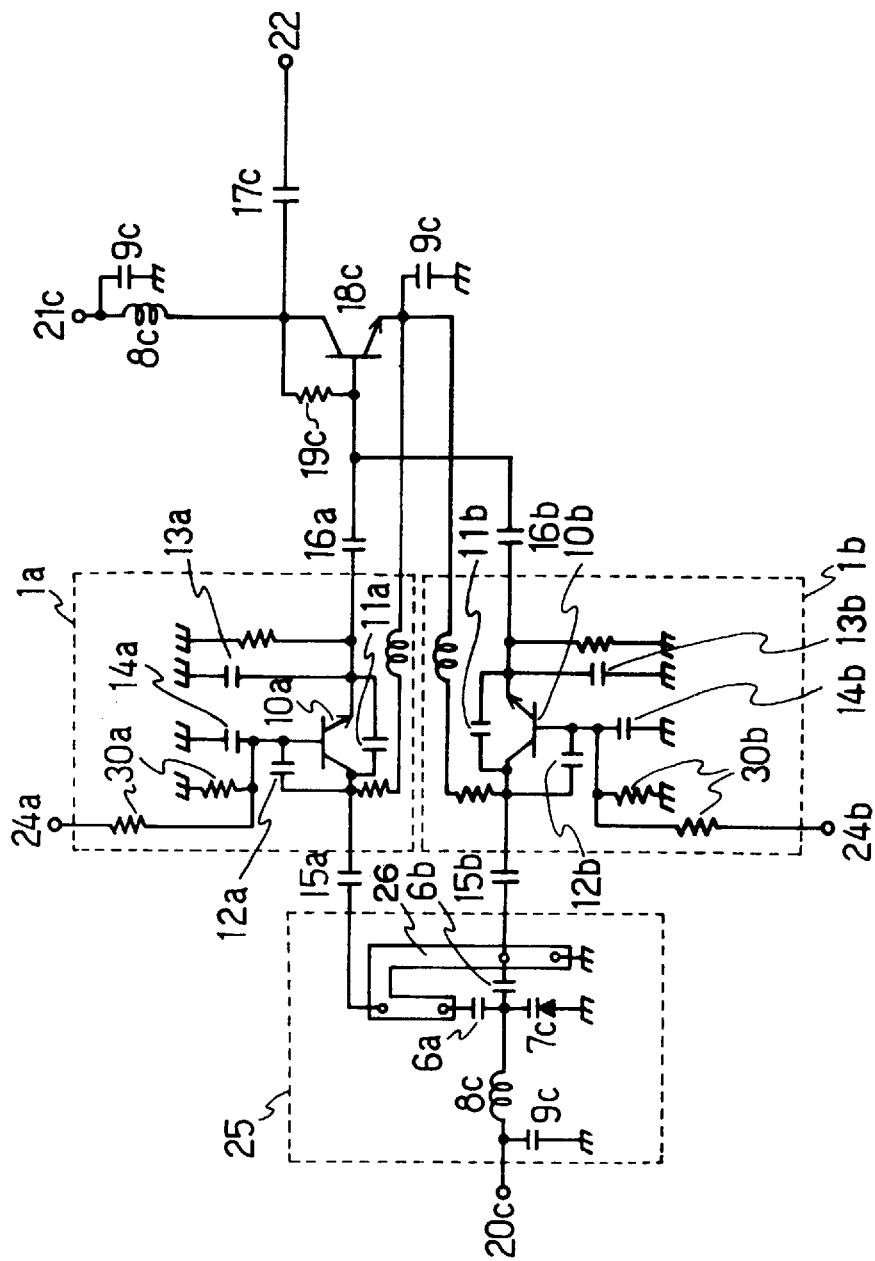
FIG. 2 shows a circuit diagram of a second embodiment of a dual band oscillator circuit according to the present invention.

In FIG. 2, 25 denotes a dual band resonance circuit portion, 26 denotes a strip line resonator, 6a and 6b denote resonator-varactor diode coupling capacitors, 7c denotes a varactor diode, 8c denotes a high-frequency choke, 9c denotes a high-frequency ground capacitor, 20c denotes a tuning voltage supply terminal, and other circuit elements are identical to those shown in FIG. 1, like elements being given like reference numbers.

The strip line resonator 26 has one end grounded and the other end connected to the cathode terminal of the varactor diode 7c via the resonator-varactor diode coupling capacitor 6a. Also, the resonator-varactor diode coupling capacitor 6b is connected between a point on the strip line resonator 26 and the cathode terminal of the varactor diode 7c.

The measured values of resonance frequency and Q values of the dual band resonance circuit portion 25 having such a configuration are shown in Table 1.

TABLE 1

Resonance frequency characteristics and Q value of dual band resonance circuit

|  | Resonance frequency (MHz) * | Resonance frequency (MHz) ** | Tuning sensitivity (MHz/V) *** | Q ** |
| --- | --- | --- | --- | --- |
| First frequency band | 762 | 804 | 42 | 44 |
| Second frequency band | 1650 | 1693 | 43 | 44 |

* Tuning voltage: 1V
** Tuning voltage: 2V
*** Tuning voltage: 1V–2V

The dual band resonance circuit 25 that resonates at two different frequencies is connected to the first oscillation transistor 10a via the resonator-transistor coupling capacitor 15a, and to the second oscillation transistor 10b via the resonator-transistor coupling capacitor 15b.

In the above configuration, when a predetermined voltage is applied to the first base bias control terminal 24a, and no voltage is applied to the second base bias control terminal 24b, the first oscillation transistor 10a is turned on, and the second oscillation transistor 10b is turned off. Since the capacitance values of each capacitor connected to the first oscillation transistor 10a are selected so that an optimal oscillation state can be obtained at the first frequency, an oscillator circuit is formed which utilizes the inductive reactance of the dual band resonance circuit portion 25 at a frequency band somewhat lower than the resonance frequency of the first frequency.

When a predetermined voltage is applied to the second base bias control terminal 24b, and no voltage is applied to the first base bias control terminal 24a, the second oscillation transistor 10b is turned on, and the first oscillation transistor 10a is turned off. Since the capacitance values of each capacitor connected to the second oscillation transistor 10b are selected so that an optimal oscillation state can be obtained at the second frequency, an oscillator circuit is formed which utilizes the inductive reactance of the dual band resonance circuit portion 25 at a frequency band somewhat lower than the resonance frequency of the second frequency.

As mentioned above, according to the dual band oscillator circuit in this embodiment, by using the dual band resonance circuit portion 25 that resonates at two frequencies, two conventional resonance circuit portions can be integrated into one. As a result, the size of the circuit can be reduced, resulting in a reduction in the size of the entire device.

One end of the resonator-transistor coupling capacitor 15a is connected to the oscillation transistor 10a that oscillates at the first frequency, and the other end is connected to a point that is a node of the voltage standing wave resonating at the second frequency, in the strip line resonator 26. Thus, the adverse effects of connecting the oscillation transistor 10a via the resonator-transistor coupling capacitor 15a, for example, a decrease in tuning voltage sensitivity with respect to the oscillation frequency of the second frequency band, are reduced. The measured values of changes in oscillation frequency and changes in tuning voltage sensitivity in the second frequency band when changing the connection point of the resonator-transistor coupling capacitor 15a and the strip line resonator 26 are shown in Table 2.

TABLE 2

Effect of changing connection point of resonator-transistor coupling capacitor 15a and strip line resonator 26

| Position of connection point * | Oscillation frequency of second frequency ** | Tuning voltage sensitivity of second frequency *** |
| --- | --- | --- |
| 3.5 mm | 1700.9 MHz | 15.4 MHz/V |
| 8.5 mm | 1676.8 MHz | 17.2 MHz/V |
| 16.0 mm | 1662.0 MHz | 21.4 MHz/V |

* Distance from short-circuit end of strip line
** Tuning voltage: 1V
*** Tuning voltage: 1V–2V (Third Embodiment)

Figure 3:
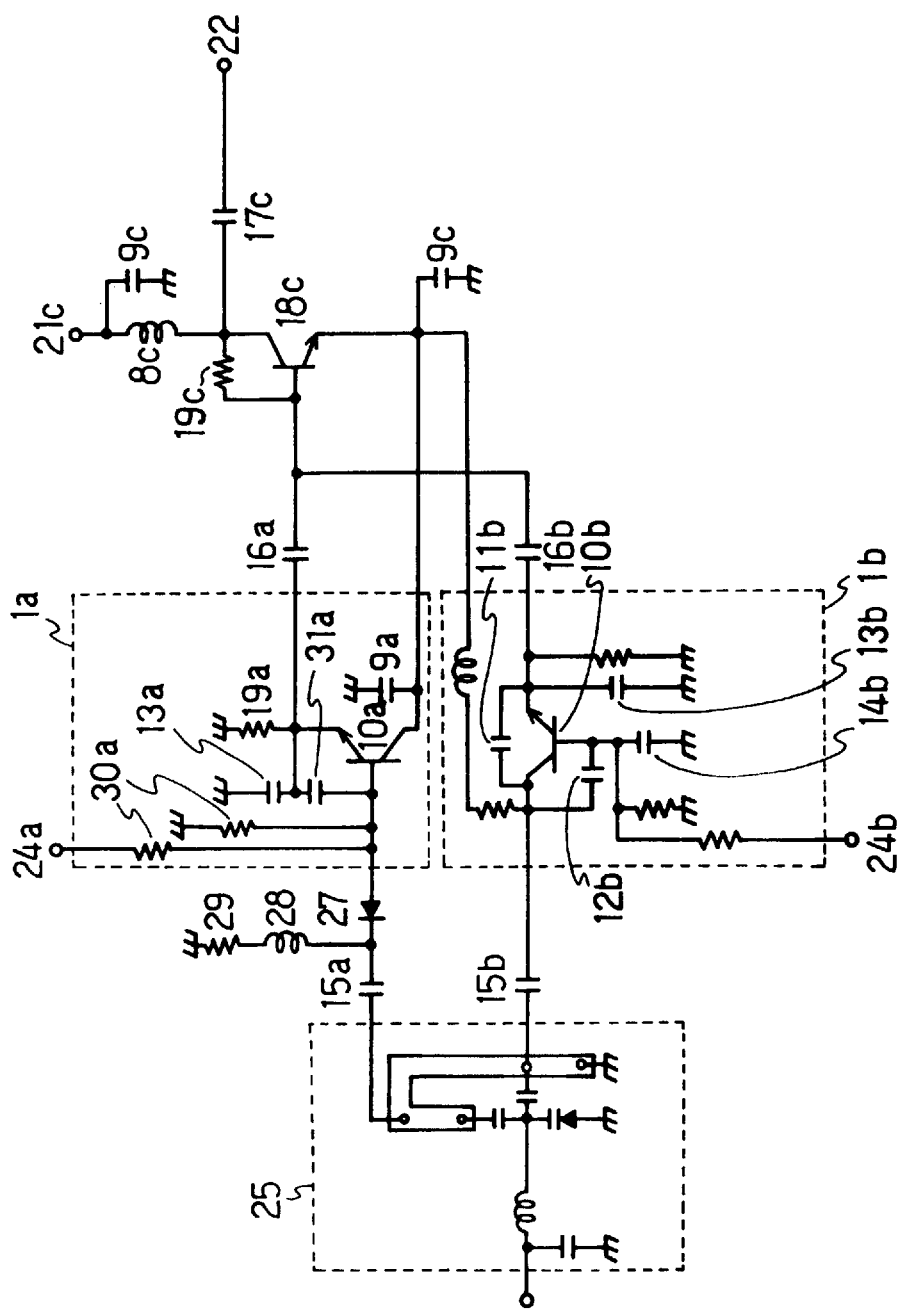
FIG. 3 shows a circuit diagram of a third embodiment of a dual band oscillator circuit according to the present invention.

In FIG. 3, 25 denotes a dual band resonance circuit portion, 15a and 15b denote resonator-transistor coupling capacitors, 27 denotes a switching diode, 28 denotes a switching diode bias choke coil, 29 denotes a switching diode bias resistor, 24a denotes a first base bias control terminal, 30a denotes a base bias resistor, 10a denotes a first oscillation transistor, 13a denotes an emitter-ground capacitor, 31a denotes a base-emitter capacitor, 9a denotes a high-frequency ground capacitor, 19a denotes a bias resistor, 16a denotes a stage-to-stage coupling capacitor, and other components are identical to those shown in FIG. 2.

The emitter-ground capacitor 13a, the base-emitter capacitor 31a, the high-frequency ground capacitor 9a, and the resonator-transistor coupling capacitor 15a have respective capacitance values selected so that optimal oscillation occur at a first frequency. 10b denotes the second oscillation transistor. The collector-emitter capacitor 11b, the collector-base capacitor 12b, the emitter-ground capacitor 13b, the base-ground capacitor 14b, the resonator-transistor coupling capacitor 15b have respective capacitance values selected so that optimal oscillation occurs at a second frequency.

The dual band resonance circuit portion 25 that resonates in two different frequencies is connected to the first oscillation transistor 10a that oscillates at the first frequency via the resonator-transistor coupling capacitor 15a and the switching diode 27, and is also connected to the second oscillation transistor 10b that oscillates at the second frequency via the resonator-transistor coupling capacitor 15b.

When a predetermined voltage is applied to the first base bias control terminal 24a, and no voltage is applied to the second base bias control terminal 24b, the first oscillation transistor 10a and the switching diode 27 are turned on, and the second oscillation transistor 10b is turned off. Since the capacitance of each capacitor connected to the first oscillation transistor 10a is selected for optimal oscillation at the first frequency, an oscillator circuit is formed which utilizes the inductive reactance of the dual band resonance circuit portion 25 at a frequency somewhat lower than the resonance frequency of the first frequency.

When a predetermined voltage is applied to the second base bias control terminal 24b, and no voltage is applied to the first base bias control terminal 24a, the second oscillation transistor 10b is turned on, and the first oscillation transistor 10a and the switching diode 27 are turned off. Since the capacitance of each capacitor connected to the second oscillation transistor 10b is selected for optimal oscillation at the second frequency, an oscillator circuit is formed which utilizes the inductive reactance of the dual band resonance circuit portion 25 at a frequency somewhat lower than the resonance frequency of the second frequency.

The impedance of the circuit including the oscillation transistor 10a at the connection point of the resonance circuit portion 25 and the resonator-transistor coupling capacitor 15a can be made very large because the switching diode 27 is off.

Also, the capacitance value of the resonator-transistor coupling capacitor 15b can be selected so that the impedance is high at the first frequency, and that the impedance is low at the second frequency.

In this example, when producing the second frequency as an output, the impedance of the circuit including the first oscillation transistor 10a at the connection point of the resonance circuit portion 25 and the resonator-transistor coupling capacitor 15a is very large because the switching diode 27 is off. Therefore, the adverse effects of connecting the first oscillation transistor 10a of the oscillator circuit on the non-operation side, for example, a decrease in tuning voltage sensitivity with respect to the oscillation frequency of the second frequency band, is reduced.

In this embodiment, the first oscillation transistor 10a that oscillates at the first frequency and the dual band resonance circuit portion 25 that resonates at two different frequencies are connected via the resonator-transistor coupling capacitor 15a and the switching diode 27. Thus, when producing an oscillation output at the second frequency, with the oscillation transistor 10b in an operation state, the adverse effects of the oscillation transistor 10a side are reduced. When oscillating at the first frequency, the resonator-transistor coupling capacitor 15b has a high impedance at the first frequency. Therefore, the adverse effect of the second oscillation transistor 10b on the oscillator circuit is similarly reduced.

(Fourth Embodiment)

Figure 4:
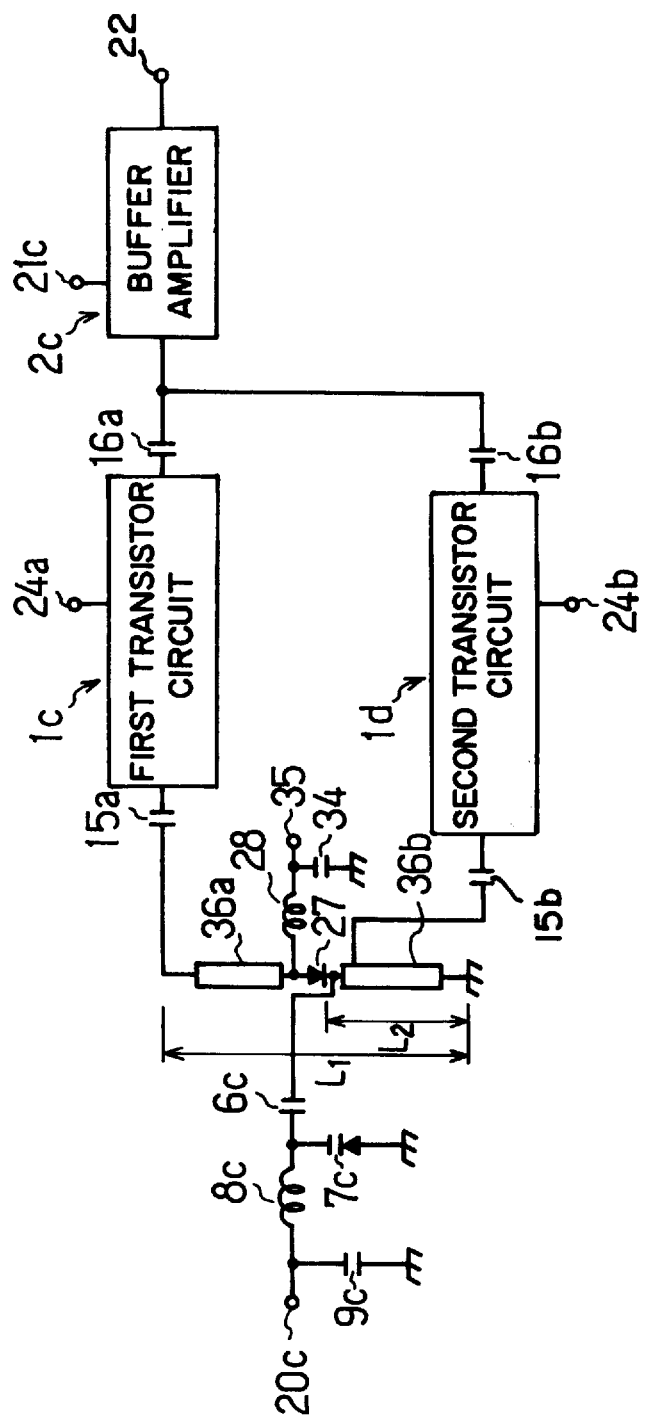
FIG. 4 shows a circuit diagram of a fourth embodiment of a dual band oscillator circuit according to the present invention.

FIG. 4 is an embodiment of the present invention that implements the dual band resonance circuit portion 25 in FIG. 2 in another form. In FIG. 4, one end of a strip line 36b is grounded, and the other end is connected to the cathode terminal of a switching diode 27 as a switch means. The anode terminal of the switching diode 27 is connected to one end of a strip line 36a, the other end of which is connected to a first transistor circuit portion 1c constituting a first oscillator circuit via a resonator-transistor coupling capacitor 15a. Furthermore, a point on the strip line 36b is connected to a second transistor circuit portion 1d constituting a second oscillator circuit via a resonator-transistor coupling capacitor 15b. The anode terminal of the switching diode 27 is connected to a band switching terminal 35 via a switching diode bias choke coil 28, and the band switching terminal 35 is grounded by a bypass capacitor 34. The sum L1 of the lengths of the strip lines 36a and 36b is set to a ¼ of the wavelength of a required first resonance frequency. Also, the length L2 of the strip line 36b is a ¼ of the wavelength of a required second resonance frequency. The first resonance frequency is lower than the second resonance frequency.

The resonance frequencies are switched depending on whether a positive voltage is applied to the band switching terminal 35. When a positive voltage is applied, the switching diode 27 is forward biased to be conductive. Therefore, the strip lines 36a and 36b operate co-operatively as an end grounded resonator. Then, the resonance frequency of the resonance circuit is determined by the sum of the lengths of the two lines.

When no positive voltage is applied to the band switching terminal 35, the switching diode 27 is in an off state. Therefore, the strip line 36b operates as an end grounded resonator independently.

In this configuration, switching the oscillation frequencies is achieved by turning the switching diode 27 on and off, depending on whether a positive voltage is applied to the band switching terminal 35 or not, and by switching the control voltages applied to the first and second base bias control terminals 24a and 24b When producing an oscillation output at the first frequency, a predetermined voltage is applied to the first base bias control terminal 24a, no predetermined voltage is applied to the second base bias control terminal 24b, and a positive voltage is applied to the band switching terminal 35. Thus, the first transistor circuit portion 1c is turned on, the second transistor circuit portion 1d is turned off, and the switching diode 27 is turned on. Then, the resonance circuit serves as a ¼-wavelength strip line resonator having one end grounded, corresponding to the sum L1 of the lengths of the strip lines 36a and 36b. At the first oscillation frequency corresponding to its resonance frequency, only the first transistor circuit portion 1c operates. After passing a stage-to-stage coupling capacitor 16a, its oscillation output is amplified in a buffer amplifier portion 2c to be output from a high-frequency output terminal 22.

When producing an oscillation output at the second frequency, a predetermined voltage is applied to the second base bias control terminal 24b, no voltage is applied to the first base bias control terminal 24a, and no positive voltage is applied to the base switching terminal 35. Thus, the first transistor circuit portion 1c is turned off, the second transistor circuit portion 1d is turned on, and the switching diode 27 is turned off. Thus, the resonance circuit is operated only by the strip line 36b and serves as a ¼-wavelength strip line resonator having a grounded end. At the second oscillation frequency, corresponding to its resonance frequency, only the second transistor circuit portion 1d is operational. After passing a stage-to-stage coupling capacitor 16b, its oscillation output is amplified in the buffer amplifier portion 2c to be output from the high-frequency output terminal 22.

According to the above configuration, particularly, when the switching diode 27 is off, the first transistor circuit 1c is disconnected. Therefore, advantageously, any adverse effect of connecting the first transistor circuit 1c is reduced.

(Fifth Embodiment)

Figure 5:
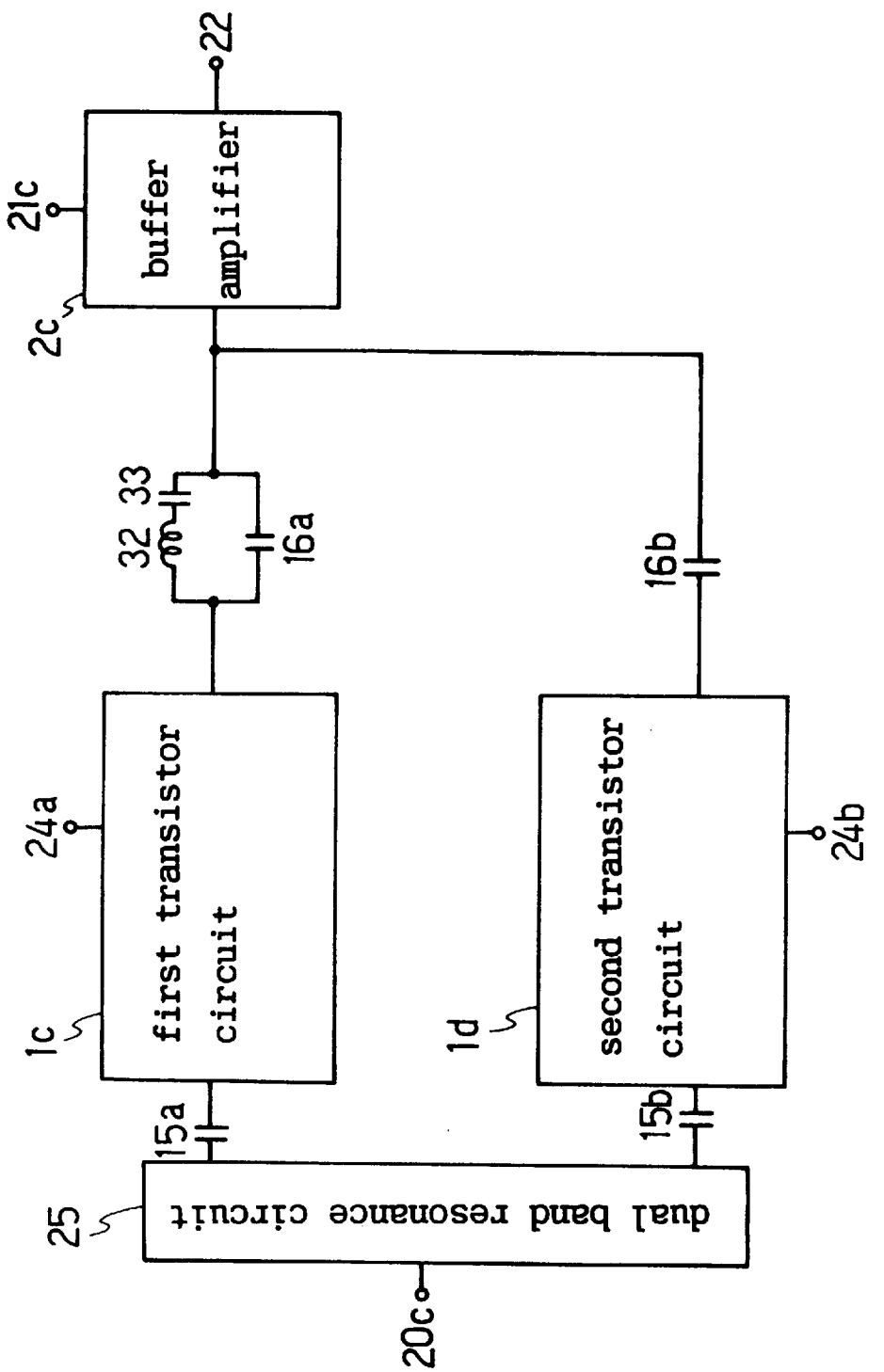
FIG. 5 shows a circuit diagram of a fifth embodiment of a dual band oscillator circuit according to the present invention.

In FIG. 5, 1c denotes a first transistor circuit portion constituting a first oscillator circuit, 1d denotes a second transistor circuit portion constituting a second oscillator circuit, 2c denotes a buffer amplifier portion, 25 denotes a dual band resonance circuit portion, 22 denotes a high-frequency output terminal, 21c denotes a power supply terminal, 24a denotes a first base bias control terminal, 24b denotes a second base bias control terminal, 20c denotes a tuning voltage supply terminal, 15a and 15b denote resonator-transistor coupling capacitors, 16a and 16b denote stage-to-stage coupling capacitors, 32 denotes a stage-to-stage coil, 33 denotes a direct-current blocking capacitor.

In FIG. 5, the coupling portion between the first transistor circuit portion 1c and the buffer amplifier portion 2c is constituted by a parallel resonance circuit including the stage-to-stage coupling capacitor 16a and the stage-to-stage coil 32. Also, the direct-current blocking capacitor 33 is added for cutting a direct-current bias.

In this embodiment, the capacitance value of the stage-to-stage coupling capacitor 16a and the inductance value of the stage-to-stage coil 32 are set so that the parallel resonance frequency is close to the second oscillation frequency of the second transistor circuit portion 1d constituting the second oscillator circuit. The impedance of the first transistor circuit 1c at the coupling point of the stage-to-stage coupling capacitors 16a and 16b and the buffer amplifier portion 2c can be made to be very large.

In this embodiment, the capacitance value of the stage-to-stage coupling capacitor 16b may be selected to have a high impedance at the first oscillation frequency produced by the first transistor circuit portion 1c, and a low impedance at the second oscillation frequency produced by the second transistor circuit portion 1d. Thus, the oscillation signal at the second frequency is amplified in the buffer amplifier portion 2c to be output from the high-frequency output terminal 22, and is minimally affected by the connection of the first transistor circuit portion 1c.

Thus, according to this embodiment, the coupling portion between the first transistor circuit portion 1c and the buffer amplifier portion 2c is constituted by the parallel resonance circuit of the stage-to-stage coupling capacitor 16a and the stage-to-stage coil 32. Therefore, when oscillating at the second frequency, with the second transistor circuit portion 1d, the effect of the first transistor circuit portion 1c can be eliminated to avoid a decrease in oscillation output.

Also, a similar effect can be obtained when, in the embodiment illustrated in FIG. 5, the stage-to-stage coupling capacitor 16a is removed to set the series resonance frequency by the stage-to-stage coil 32 and the direct-current blocking capacitor 33 to be between the oscillation frequencies of the first oscillator circuit (i.e., the transistor circuit portion 1c) and the second oscillator circuit (i.e., the transistor circuit portion 1d).

(Sixth Embodiment)

Figure 6:
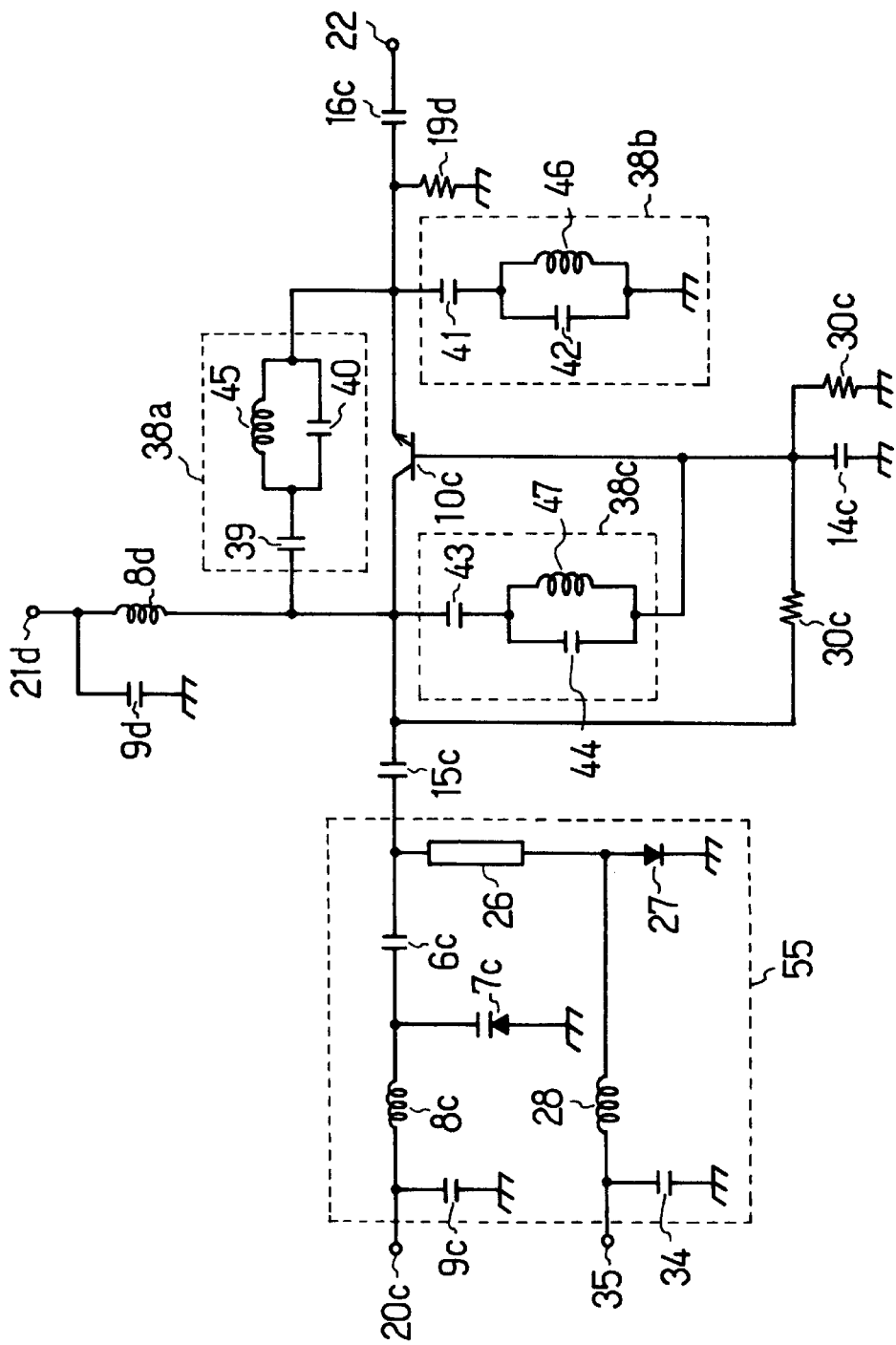
FIG. 6 shows a circuit diagram of a sixth embodiment of a dual band oscillator circuit according to the present invention.

In FIG. 6, a resonance circuit block 55 functions as an inductive impedance circuit and has a high Q value as a resonance circuit. A tuning voltage supply terminal 20c is connected to the cathode side of a varactor diode 7c and to a resonator-varactor coupling capacitor 6c by a high-frequency choke 8c having an appropriate inductance value. The anode side of the varactor diode 7c is grounded. A strip line resonator 26 connected to the other end of the resonator-varactor coupling capacitor 6c has a required inductance component at a desired frequency band and may be formed on a dielectric substrate. The other end of the strip line resonator 26 is connected to the anode side of a switching diode 27, the cathode side of which is grounded. One end of a switching diode bias choke coil 28 having an appropriate inductance value is connected to a band switching terminal 35, and the other end of the switching diode bias choke coil 28 is connected to the anode of the switching diode 27.

A high-frequency choke 8d having an appropriate inductance value is connected between a power supply terminal 21d on which a direct-current supply voltage is applied and the collector of a transistor 10c for oscillation. A resistor 19d is connected between the emitter of the transistor 10c and the ground. Two resistors 30c, 30c are connected in series between the collector of the transistor 10c and the ground, and the connection point of the resistors is connected to the base of the transistor 10c. A resonator-transistor coupling capacitor 15c connected between the collector of the transistor 10c and the resonance circuit block 55 couples the resonance circuit block 55 and the transistor 10c at high frequencies. A base-ground capacitor 14c is connected between the base of the transistor 10c and the ground to operate the transistor 10c as a grounded base type high-frequency oscillator circuit. The output is obtained from an output terminal 22 through a stage-to-stage coupling capacitor 16c connected to the emitter of the transistor 10c.

Also, a feedback block 38a is connected between the collector and emitter of the transistor 10c. This is constituted by a circuit in which the parallel circuit of a capacitor 40 and an inductor 45 is connected in series with a capacitor 39. The value of each element is selected so that the oscillation condition is satisfied at the two desired frequencies and that a desired capacitive impedance for high C/N ratio characteristics can be obtained.

Feedback blocks 38b and 38c having a similar circuit configuration are connected between the emitter of the transistor 10c and the ground, and between the collector and base of the transistor 10c, respectively. The value of each element constituting the respective feedback blocks is selected in a manner similar to that of 38a.

According to the above configuration, the resonance frequencies of the resonance circuit block 55 are switched depending on whether a positive voltage is applied to the band switching terminal 35 or not. When a positive voltage is applied, the switching diode 27 is forward biased to be conductive, and the strip line resonator 26 operates as a grounded end resonator. Thus, the resonance frequency is determined by the line length of the strip line resonator 26 to be somewhat higher than the first frequency.

When no positive voltage is applied to the band switching terminal 35, the switching diode 27 is in an off state, and the strip line resonator 26 operates as an open end resonator. Thus, the resonance frequency is at the second frequency, about twice that of the case where a positive voltage is applied to the band switching terminal 35.

As mentioned above, the resonance circuit block 55 may resonate at two different frequencies depending on whether a positive voltage is applied to the band switching terminal 35.

According to this configuration, when producing an oscillation output at the first frequency, a positive voltage is applied to the band switching terminal 35 to set the switching diode 27 in an "on" state. Thus, the resonance circuit block 55 has an inductive impedance at the first frequency. Since each of the feedback circuit blocks 38a, 38b and 38c has an impedance adjusted to satisfy the oscillation condition at the first frequency and optimize the C/N ratio, the oscillation condition at the first oscillation frequency is satisfied, and an output at the first oscillation frequency is obtained from the high-frequency output terminal 22.

When producing an oscillation output at the second frequency, no positive voltage is applied to the band switching terminal 35, thus setting the switching diode 27 in an "off" state. Thus, the resonance circuit block 55 has an inductive impedance in the second frequency band. Since each of the feedback circuit blocks 38a, 38b and 38c has an impedance adjusted to satisfy the oscillation condition at the second frequency band and optimize the C/N ratio, the oscillation condition at the second oscillation frequency is satisfied, and an output at the second oscillation frequency is obtained from the high-frequency output terminal 22.

In this embodiment, with only one transistor used for oscillation, oscillation in two different frequency bands can be implemented without any degradation in C/N ratio characteristics.

Figure 8:
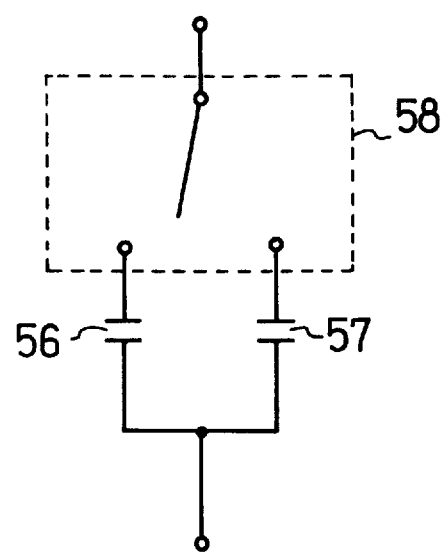
FIG. 8 shows a circuit diagram of another example of a feedback circuit used in the dual band oscillator circuit in FIG. 6.

In this embodiment, each of the feedback blocks 38a, 38b and 38c is constituted by an impedance element having two different impedances. However, a similar effect can be obtained if each of the feedback circuit blocks 38a, 38b and 38c is alternatively constituted by a circuit in which two capacitors 56 and 57 are switched by a semiconductor switch element 58, as illustrated in FIG. 8.

Figure 9:
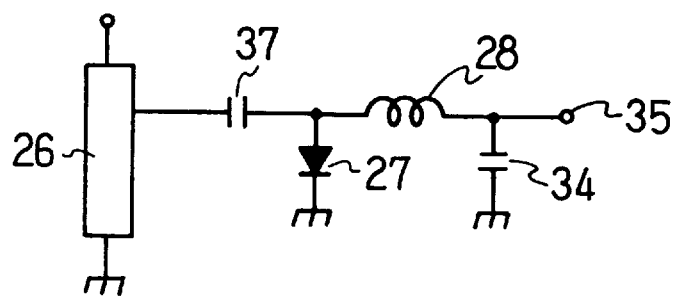
FIG. 9 shows a circuit diagram of another example of a resonance circuit used in the dual band oscillator circuit in FIG. 6.

Another example of a configuration of a resonator and a semiconductor switch element in resonance circuit block 55 in this embodiment is shown in FIG. 9.

In FIG. 9, one end of a strip line resonator 26 is grounded, the anode of a switching diode 27 is connected to one point on the strip line resonator 26 via a capacitor for DC isolation, and the cathode of the diode 27 is grounded. In this example, the switching diode 27 is turned on/off, depending on whether a positive voltage is applied to a band switching terminal 35 or not, and the line length to the short-circuit end, a tip end, of the strip line resonator 26 is changed. Thus, the resonance frequency can be changed, and the resonance circuit block 55 can obtain resonance in two different frequency bands.

(Seventh Embodiment)

Figure 7:
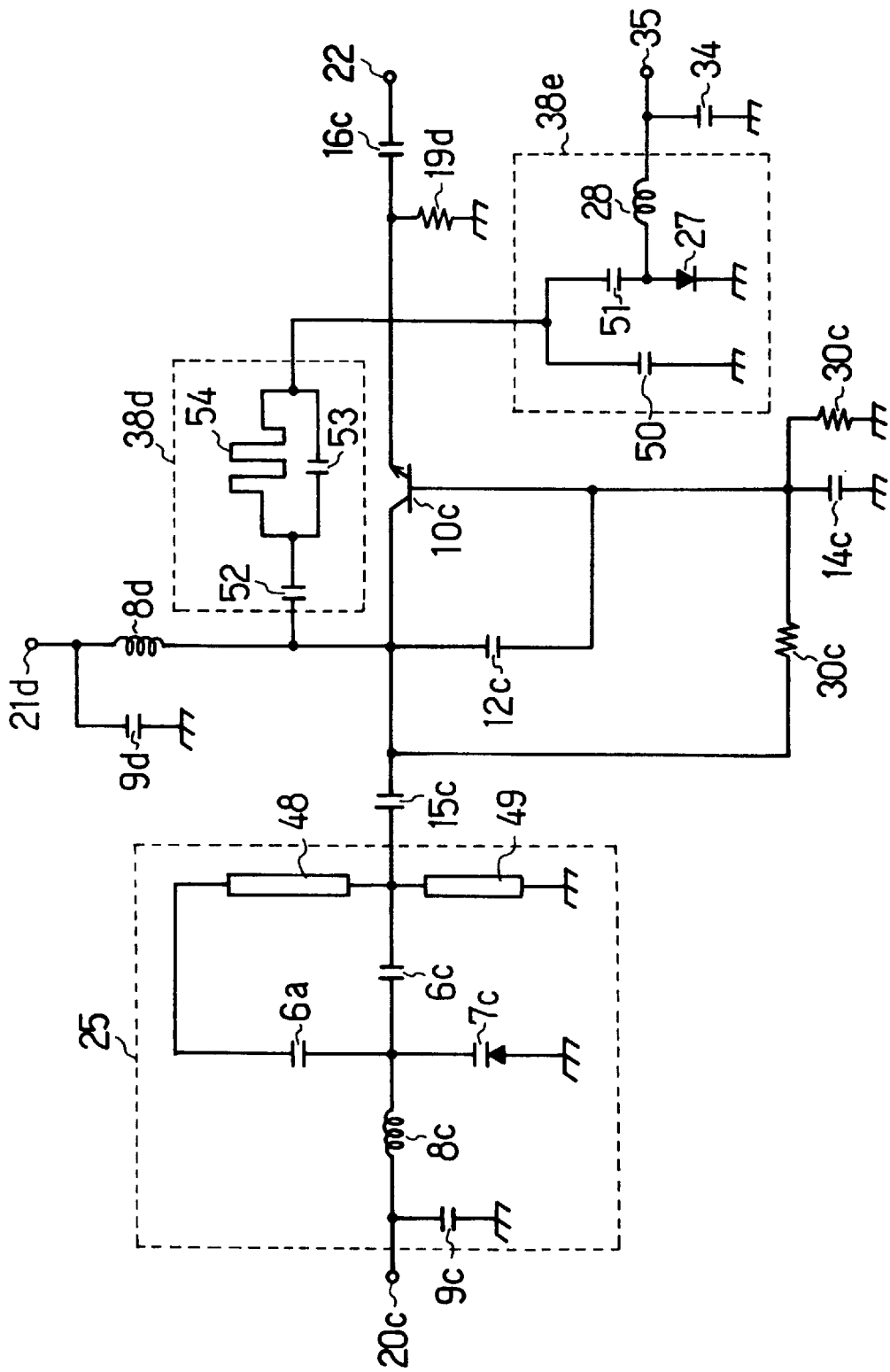
FIG. 7 shows a circuit diagram of a seventh embodiment of a dual band oscillator circuit according to the present invention.

In FIG. 7, a dual band resonance circuit portion 25 is constituted as follows. One end of a strip line resonator 49 is grounded, and the other end is connected to a strip line resonator 48 and a resonator-varactor coupling capacitor 6c. The other end of the strip line resonator 48 is connected to a resonator-varactor coupling capacitor 6a. The other end of the resonator-varactor coupling capacitor 6a is connected to the resonator-varactor coupling capacitor 6c, the cathode of a varactor diode 7c, and a high-frequency choke 8c having an appropriate inductance value. The anode of the varactor diode 7c is grounded. The other end of the high-frequency choke 8c is connected to a tuning voltage supply terminal 20c.

A resonator-transistor coupling capacitor 15c is connected between the connection point of strip line resonators 48 and 49 and the collector of an oscillation transistor 10c.

A feedback circuit block 38d is connected between the collector and emitter of the oscillation transistor 10c and is constituted by a circuit in which a capacitor 52 is connected in series with the parallel circuit of a capacitor 53 and a strip line 54 formed on a dielectric substrate. The characteristics of two capacitors 52 and 53, and the strip line 54 are selected to satisfy the oscillation condition at two desired frequencies and obtain a desired capacitive impedance for high C/N ratio characteristics in the same way as in the feedback circuit block 38a in FIG. 6.

A feedback circuit block 38e is connected between the emitter of the oscillation transistor 10c and ground, and capacitors 50 and 51 are connected to the emitter of the oscillation transistor 10c. The anode of a switching diode 27 is connected to an oscillation frequency band switching terminal 35 via a switching diode bias choke 28, and the cathode of the switching diode 27 is grounded. The capacitive impedance between the emitter of the oscillation transistor 10c and the ground is switched by turning the switching diode 27 on and off by a control voltage signal applied to the band switching control terminal 35. The capacitances of the capacitors 50, 51 are selected so that the oscillation condition in two desired frequency bands and high C/N ratio characteristics can be satisfied.

According to the above configuration, the dual band resonance circuit 25 has no switch such as a semiconductor switch element. However, it has a resonance frequency somewhat higher than the desired two oscillation frequencies and functions as a desired inductive impedance circuit in two frequency bands. On the other hand, the feedback circuit block 38d has a desired capacitive impedance in two oscillation frequency bands. Furthermore, the feedback circuit block 38e similarly has a desired capacitive impedance in two oscillation frequency bands depending on a control voltage from the band switching terminal 35. Thus, oscillation in two desired frequency bands can be implemented with a high C/N ratio value.

Figure 10:
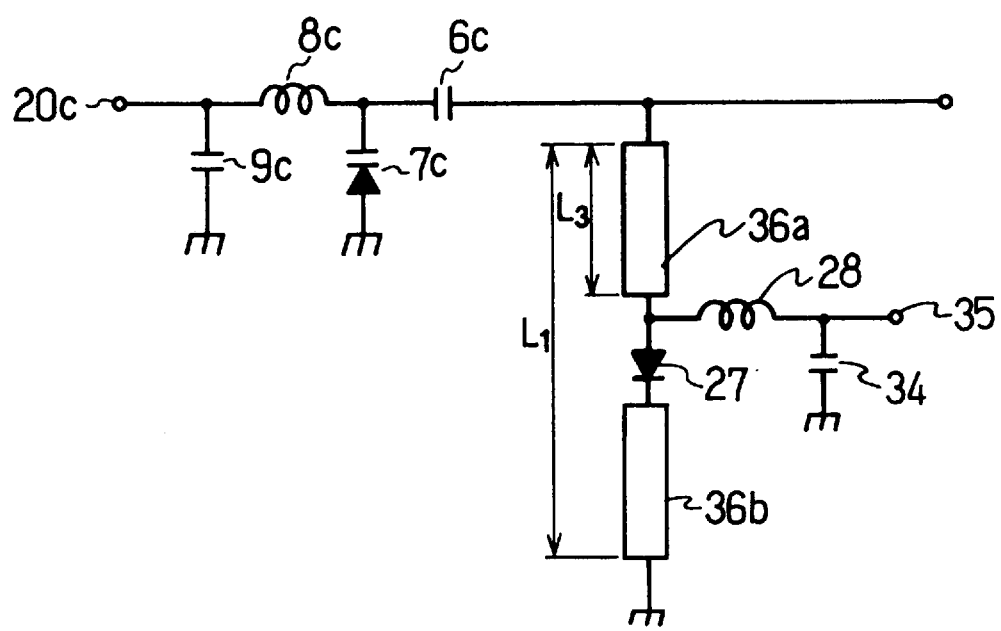
FIG. 10 shows a circuit diagram of another example of a resonance circuit used in the dual band oscillator circuit in FIG. 7.
Figure 11:
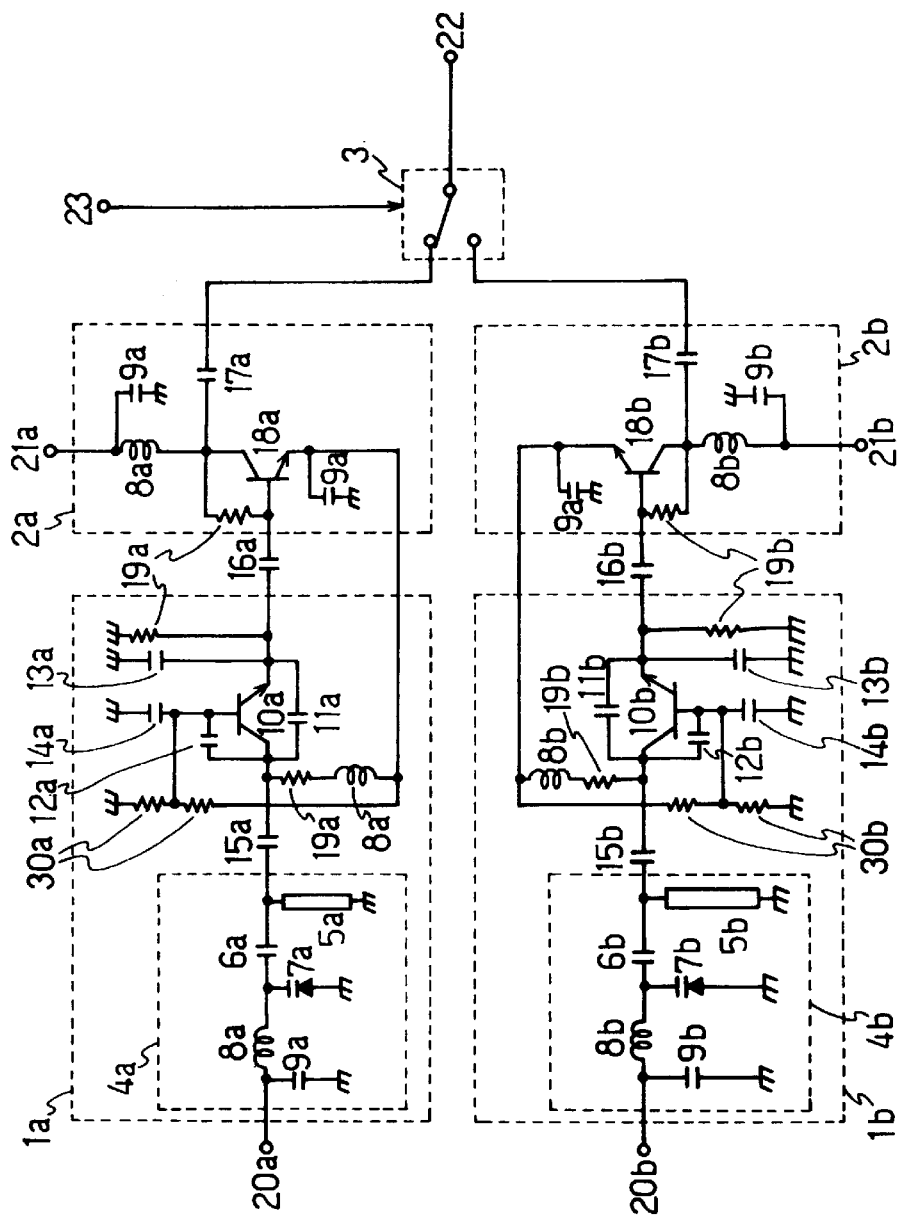
FIG. 11 shows a circuit diagram of a conventional dual band oscillator circuit.

A similar effect is obtained if the resonator portion of the dual band resonance circuit portion 25 is configured as shown in FIG. 10 in this embodiment. In FIG. 10, one end of a strip line 36b is grounded, and the other end is connected to the cathode of a switching diode 27, the anode of which is connected to one end of a strip line 36a, the other end of which is connected to the cathode of a varactor diode 7c via a resonator-varactor coupling capacitor 6c. The anode of the varactor diode 7c is grounded.

A tuning voltage from a tuning voltage supply terminal 20c is applied to the varactor diode through a high-frequency choke 8c. The anode of the switching diode 27 is connected to the band switching terminal 35 via a switching diode bias choke coil 28.

The sum L1 of the lengths of the strip lines 36a and 36b is set to a ¼ of the wavelength of a desired first resonance frequency. The length L3 of the strip line 36a is set to a ½ of the wavelength of a desired second resonance frequency. The first resonance frequency is lower than the second resonance frequency. Also, the first resonance frequency is set somewhat higher than the first oscillation frequency. Similarly, the desired second resonance frequency is set somewhat higher than the second oscillation frequency.

In the above configuration, when a positive voltage is applied to the band switching terminal 35, the switching diode 27 is turned on, and the resonator operates as a grounded end ¼-wavelength resonator having a length L1 by the addition of the strip lines 36a and 36b. When no positive voltage is applied to the band switching terminal 35, the switching diode 27 is turned off, and the resonator operates as an open end ½-wavelength resonator using only the strip line 36a. Therefore, by incorporating this circuit in the dual band resonance circuit block 25 in FIG. 7, oscillation at two different frequencies corresponding to the resonance frequencies may be achieved.

Adjustment of the oscillation frequency is performed by adjusting the length L3 of the strip line 36a when the switching diode 27 is off, and by adjusting the sum L1 of the lengths of the strip lines 36a and 36b when the switching diode 27 is on. Thus, by adjusting the lengths of the strip lines 36a and 36b, the oscillator circuit can be operated at any two frequencies.

The invention may be embodied in other forms without departing from the spirit or essential characteristics thereof. The embodiments disclosed in this application are to be considered in all respects as illustrative and not limiting, the scope of the invention is indicated by the appended claims rather than by the foregoing description, and all changes which come within the meaning and range of equivalency of the claims are intended to be embraced therein.

What is claimed is:

1. A dual band oscillator circuit for producing an oscillating output at either one of first and second frequencies, comprising:

a first oscillator circuit operable at a first frequency, including a first oscillation transistor;

a second oscillator circuit operable at a second frequency, including a second oscillation transistor;

a buffer amplifier circuit to which an output of the first oscillator circuit is input through a first stage-to-stage coupling element and an output of the second oscillator circuit is input through a second stage-to-stage coupling element, the buffer amplifier circuit including a buffer transistor; and first and second input terminals to apply a first and second control voltages for controlling operation of the first and second oscillator circuits respectively so as to alternatively operate one of the first and second oscillator circuits;

wherein a direct current component flowing through the buffer transistor also flows through the first or second oscillation transistor that is under operation.

2. The dual band oscillator circuit according to claim 1, comprising a dual band resonance circuit resonant at both the first and second frequencies, wherein the dual band resonance circuit is connected to the first oscillation transistor via a first resonator-transistor coupling capacitor and is connected to the second oscillation transistor via a second resonator-transistor coupling capacitor.

3. The dual band oscillator circuit according to claim 2, wherein the dual band resonance circuit comprises a strip line resonator having a ground end and an open end, a varactor diode whose anode terminal is grounded, a first capacitor connected between the open end of the strip line resonator and a cathode terminal of the varactor diode, and a second capacitor connected between the cathode terminal of the varactor diode and a predetermined position between the ground end and the open end of the strip line resonator.

4. The dual band oscillator circuit according to claim 2, wherein the first resonator-transistor coupling capacitor is connected to the first oscillation transistor at a first side and is connected to a predetermined position between a ground end and an open end of a strip line resonator of the dual band resonance circuit, the position being a node of a voltage standing wave resonating at the second frequency.

5. The dual band oscillator circuit according to claim 2, wherein a switch element is interposed between the first resonator-transistor coupling capacitor and the first oscillation transistor, and the switch element conducts when the first oscillator circuit operates and is in a disconnected state when the second oscillator circuit operates.

6. The dual band oscillator circuit according to claim 2, wherein the dual band resonance circuit comprises a first strip line whose first terminal is grounded, a switch means whose first terminal is connected to a second terminal of the first strip line, and a second strip line connected to a second terminal of the switch means, and wherein one of a resonance frequency of the first strip line and a resonance frequency of the first and second strip lines is selected by switching the switch means.

7. The dual band oscillator circuit according to claim 6, wherein a sum of lengths of the first and second strip lines is a ¼ of a wavelength of the first resonance frequency, and a length of the first strip line is a ¼ of a wavelength of the second resonance frequency in the dual band resonance circuit.

8. The dual band oscillator circuit according to claim 1, wherein an impedance of the first stage-to-stage coupling element is selected so as to be in a conductive state at the first frequency and in an open state at the second frequency.

9. A dual band oscillator circuit comprising:

a transistor for oscillation;

feedback circuits connected across the transistor, each feedback circuit having predetermined impedance values at two or more different frequencies; and a resonance circuit connected to an input of the transistor, selectable between one of two or more resonance frequencies wherein the feedback circuits comprise impedance elements connected between the collector and base, between the base and emitter, and between the emitter and collector of the transistor, respectively, and at least one of the impedance elements comprises a first capacitance element and an inductance element connected in parallel, and a second capacitance element connected in series with the parallel connected elements.

10. A dual band oscillator circuit comprising:

a transistor for oscillation;

feedback circuits connected across the transistor, each feedback circuit having predetermined impedance values at two or more different frequencies; and a resonance circuit connected to an input of the transistor, selectable between one of two or more resonance frequencies, the resonance circuit including resonators corresponding to the two or more resonance frequencies respectively, and a semiconductor switch element for selecting one of the resonators, the resonance circuit further including a first strip line whose first terminal is grounded, a switch means whose first terminal is connected to a second terminal of the first strip line, and a second strip line connected to a second terminal of the switch means, and either one of a resonance frequency of one of the first and second strip lines and a resonance frequency of both the first and second strip lines is selectable by switching the switch means, a sum of lengths of the first and second strip lines being ¼ of a wavelength of a first resonance frequency, and a length of the second strip line being ½ of a wavelength of a second resonance frequency.

11. A dual band oscillator circuit comprising:

a transistor for oscillation;

feedback circuits connected across the transistor, at least one of the circuits adapted to select one of two or more different impedances; and a resonance circuit connected to an input of the transistor, having two or more resonance frequencies, the feedback circuits including impedance elements connected between the collector and base, between the base and emitter, and between the emitter and collector of the transistor, respectively, and at least one of the feedback circuits having a selectable impedance;

wherein at least one of the impedance elements includes a first capacitance element and an inductance element connected in parallel, and a second capacitance element connected in series with the parallel-connected elements.

12. A dual band oscillator circuit comprising:

a transistor for oscillation;

feedback circuits connected across the transistor, at least one of the circuits adapted to select one of two or more different impedances; and a resonance circuit connected to an input of the transistor, having two or more resonance frequencies, the feedback circuits including impedance elements connected between the collector and base, between the base and emitter, and between the emitter and collector of the transistor, respectively, and at least one of the feedback circuits having a selectable impedance;

wherein at least one of the impedance elements comprises a first capacitance element, a second capacitance element, and a semiconductor switch element for selecting between the first and second capacitance elements.

13. A dual band oscillator circuit comprising:

a transistor for oscillation;

feedback circuits connected across the transistor, at least one of the circuits adapted to select one of two or more different impedances; and a resonance circuit connected to an input of the transistor, having two or more resonance frequencies, the feedback circuits including impedance elements connected between the collector and base, between the base and emitter, and between the emitter and collector of the transistor, respectively, and at least one of the feedback circuits having a selectable impedance;

wherein at least one of the impedance elements comprises a first capacitance element and a semiconductor switch element connected in series, and a second capacitance element connected in parallel with the series-connected elements.

* * * * *